US012601053B2

(12) United States Patent
Pandey et al.

(10) Patent No.:  US 12,601,053 B2
(45) Date of Patent:       Apr. 14, 2026

(54) DOG BONE EXHAUST SLIT TUNNEL FOR PROCESSING CHAMBERS

(71) Applicant: Applied Materials, Inc., Santa Clara, CA (US)

(72) Inventors: Vishwas Kumar Pandey, Madhya Pradesh (IN); Ala Moradian, Sunnyvale, CA (US); Zhepeng Cong, San Jose, CA (US)

(73) Assignee: APPLIED MATERIALS, INC., Santa Clara, CA (US)

( * ) Notice:    Subject to any disclaimer, the term of this patent is extended or adjusted under 35 U.S.C. 154(b) by 644 days.

(21) Appl. No.: 17/955,785

(22) Filed:       Sep. 29, 2022

(65)                Prior Publication Data

US 2024/0110278 A1       Apr. 4, 2024

(51) Int. Cl.
*C23C 16/44*          (2006.01)
*H01L 21/67*          (2006.01)

(52) U.S. Cl.
CPC .... *C23C 16/4412* (2013.01); *H01L 21/67017* (2013.01)

(58) Field of Classification Search
None
See application file for complete search history.

(56)                References Cited

U.S. PATENT DOCUMENTS

| | | | |
|---|---|---|---|
| 11,049,696 B2 * | 6/2021 | Pandey .............. | C23C 16/45582 |
| 2003/0124820 A1 | 7/2003 | Johnsgard et al. | |
| 2014/0079376 A1 | 3/2014 | Tseng et al. | |
| 2014/0326185 A1 * | 11/2014 | Lau ...................... | C23C 16/4412 |
| | | | 118/728 |
| 2015/0096722 A1 | 4/2015 | Zweiback et al. | |
| 2017/0338135 A1 | 11/2017 | Ranish et al. | |
| 2020/0017971 A1 * | 1/2020 | Kao ..................... | C23C 16/4412 |

FOREIGN PATENT DOCUMENTS

| | | |
|---|---|---|
| CN | 111364021 B | 7/2022 |
| KR | 20160003846 A | 1/2016 |

OTHER PUBLICATIONS

International Search Report and Written Opinion for Application No. PCT/US2023/017157 (APPM/44020811WO) dated Jul. 24, 2023.
Korean Office Action for Application No. 10-2025-7013684 dated Oct. 23, 2025.

* cited by examiner

*Primary Examiner* — Binu Thomas
(74) *Attorney, Agent, or Firm* — Patterson + Sheridan, LLP

(57)                ABSTRACT

A processing chamber is disclosed and includes a chamber body. The chamber body has a first side, a second side opposite the first side, a window assembly, and a base. The first and second side, the window assembly and the base define a thermal processing region. A flow assembly is disposed adjacent the first side and configured to introduce a processing gas into the thermal processing region. An exhaust slit assembly is disposed adjacent the second side. The exhaust slit assembly has an opening exposed to the thermal processing region. The opening having a center and an outer edge of the opening. The center of the opening and edge of the opening vertically defined between the window assembly and the base. Wherein an outer height at the edge of the opening is at least 30% larger in a vertical direction than a center height at the center of the opening.

20 Claims, 6 Drawing Sheets

DOG BONE EXHAUST SLIT TUNNEL FOR PROCESSING CHAMBERS

BACKGROUND

Field

Embodiments of the present disclosure generally relate to equipment for semiconductor device fabrication, and in particular, to an exhaust slit tunnel for processing chambers.

Description of the Related Art

The production of silicon integrated circuits has placed difficult demands on fabrication steps to increase the number of devices while decreasing the minimum feature sizes on a chip. Additionally, increased cost pressure on device fabricators creates the need to increase throughput at semiconductor manufacturing facilities. Semiconductor substrates are processed for a wide variety of applications, including the fabrication of integrated devices and microdevices. One method of processing substrates includes depositing a material, such as a semiconductor material or a conductive material on an upper surface of the substrate. The deposition, modification, or removal of semiconductor materials on a substrate depends in large part on a flux of purge and process gases across the surface of the substrate. During a deposition operation, the process gas and the purge gas, such as an inert gas, flow simultaneously into a process chamber, such as an epitaxial (EPI) chamber. As a result, semiconductor-manufacturing processes must perform film formation and modification operations at low and/or high speed with extreme uniformity. One such process is the deposition of a film on a semiconductor substrate. In such a process, a gas mixture flows into a processing chamber and deposits or modifies an underlying layer of a substrate by incorporation of precursor and/or byproducts therein to form the film.

A profile of the process gases flowing through the processing chamber from the leading edge to training edge of the substrate has a correlation to uniformity and quality of the deposited material layer. The shape of the profile of the process gases may to selected to enable better uniformity of deposited material layers. The demand for smaller and higher density of devices requires increased control over the shape of the process gases profile. Conventional processing chambers have difficulty meeting demands for improved profile control of the process gases provided across the substrate, thus making high tolerance, uniform thickness deposition challenging to obtain.

Therefore, an improved apparatus for controlling process gases in semiconductor processing chamber is needed.

SUMMARY

A processing chamber is disclosed herein that includes a slit valve tunnel having a variable gap opening. The processing chamber includes a chamber body. The chamber body has a first side, a second side opposite the first side, a window assembly, and a base. The first side, the second side, the window assembly and the base define and enclose a thermal processing region. A flow assembly is disposed adjacent the first side and is configured to introduce a processing gas into the thermal processing region. An exhaust slit assembly is disposed adjacent to the second side. The exhaust slit assembly has an opening exposed to the thermal processing region. The opening having a center and an outer edge of the opening. The center of the opening and edge of the opening vertically defined between the window assembly and the base. Wherein an outer height at the edge of the opening is at least 30% larger in a vertical direction than a center height at the center of the opening.

In other embodiments, an exhaust slit assembly is disposed adjacent to the second side. The exhaust slit assembly has an elongated opening exposed to the thermal processing region. The elongated opening has a center height of the opening disposed at a center of the elongated opening and an outer height of the opening disposed along an outer edge of the elongated opening. The outer height of the opening is at least 30% larger vertically than the center height of the opening.

In other embodiments, a method for thermally processing a substrate is provided. The method includes flowing a processing gas into a processing chamber through a first opening and into a processing region containing a substrate. The processing gas is flowed laterally across the substrate from the first opening towards a second opening of the processing chamber. The second opening having a higher conductance at the outer edges of the second opening relative to a center of the second opening. The substrate is heated in the presence of the processing gas and a layer of material is deposited on the heated substrate in the presence of the processing gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to semiconductor device fabrication equipment and methods for processing a substrate therein, and in particular to an exhaust assembly for a processing chamber. The exhausts assembly has an opening shaped to provide uniform velocity of processing gases across a substrate disposed in the processing chamber. A dog bone or dumbbell cross section opening profile is provided for the opening instead of a conventional uniform cross sectional profile. The dog bone or dumbbell cross section opening profile has a smaller opening, i.e., gap, at the center with the opening increasing from center towards the edge. The smaller area of the opening at center promotes better flow over the substrate for improved processing uniformity.

Figure 1A:
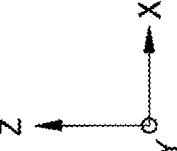
FIG. 1A is a schematic of a processing system, according to one or more embodiments described and discussed herein.

FIG. 1A illustrates a substrate processing system 199 that includes an epitaxial (EPI) processing chamber 100. The EPI processing chamber 100 is utilized to grow an epitaxial film on a substrate, such as a substrate 150. Alternately, the EPI processing chamber 100 may be configured for etching.

The EPI processing chamber 100 includes a chamber body 108. The chamber body 108 includes a susceptor assembly 124, a lower window 120, an upper window 122 and a base plate 114. The upper window 122, the base plate 114, and the lower window 120 enclose an internal volume 110 of the chamber body 108. The susceptor assembly 124 is disposed in the internal volume 110 of the chamber body 108.

The EPI processing chamber 100 additionally includes a plurality of lamp modules 101. The lamp modules 101 includes an upper lamp module 102 and a lower lamp module 104. The upper lamp module 102 may include a pyrometer passage in which a pyrometer, such as a scanning pyrometer, to measure the temperature of the substrate 150 or components of the chamber body 108.

The upper window 122 is an optically transparent window, such that radiant energy produced by the upper lamp module 102 passes therethrough. In some embodiments, the upper window 122 is formed of a quartz or a glass material. The upper window 122 has a dome shape and in some embodiments, is also called an upper dome. The outer edges of the upper window 122 form peripheral supports. The peripheral supports are disposed on top of the base plate 114.

The base plate 114 may include one or more cooling channels 188. The cooling channels 188 are configured to have a fluid flow therethrough for maintaining a temperature of the base plate 114. The upper window 122 and base plate 114 may define a processing region 129. The substrate 150 is exposed to the processing gasses in the processing region 129 for processing.

A liner 154 is located inside of the opening of the base plate 114. The liner 154 has ring shaped. The liner 154 is configured to separate the inner surface of the base plate 114 from the internal volume 110. The liner 154 shields the inner surface of the base plate 114 from process gases within the internal volume 110 and further protects the internal volume 110 from particles or other contaminants released by the base plate 114. The liner 154 further serve to reduce heat transfer from the process volume to the base plate 114. The reduced heat transfer improves uniform heating of the substrate 150 and enables more uniform deposition on the substrate 150 during processing.

The lower window 120 is disposed between the base plate 114 and the lower lamp module 104. The lower window 120 is optically transparent, such that radiant energy produced by the lower lamp module 104 passes therethrough. In some embodiments, the lower window 120 is formed from a quartz or a glass material. The lower window 120 has a dome shape, and in some embodiments, is also called a lower dome. The outer edges of the lower window 120 form peripheral supports. The base plate 114 is disposed on the peripheral supports of the lower window 120.

The lower lamp module 104 is disposed below the susceptor assembly 124 and is configured to heat a bottom side of the substrate 150 when the substrate is disposed on the susceptor assembly 124. The lower lamp module 104 includes a plurality of lamp apertures. Each of the plurality of lamp apertures has a lamp 135 disposed therein. Each lamp 135 is electrically coupled to a power source (not shown). The orientation of the lamps 135 is generally parallel to a vertical centerline of the EPI processing chamber 100. For example, the lamps 135 may be disposed in an orientation generally perpendicular to the substrate 150. Alternately, the orientation of the lamp 135 is parallel to the substrate 150.

The lower lamp module 104 further includes a susceptor shaft passage 195. The susceptor shaft passage 195 is disposed through the middle of the lower lamp module 104. A support shaft 132 is disposed through the susceptor shaft passage 195 and coupled to the susceptor assembly 124. The susceptor shaft passage 195 is sized to allow the support shaft of the susceptor assembly 124 to pass through the lower lamp module 104 and to supply bottom purge.

The susceptor assembly 124 is disposed in the internal volume 110 and configured to support the substrate 150 on a substrate support surface 151. The susceptor assembly 124 is disposed between the upper lamp module 102 and the lower lamp module 104. The lower window 120 is disposed between the susceptor assembly 124 and the lower lamp module 104. The upper window 122 is disposed between the susceptor assembly 124 and the upper lamp module 102. The upper lamp module 102 is disposed over the susceptor assembly 124 and configured to heat the substrate 150 disposed on the susceptor assembly 124. The upper lamp module 102 includes a plurality of lamp apertures. Each of the plurality of lamp apertures includes a lamp base, or socket, in which a single lamp 135 is disposed therein. The orientation of the lamp 135 is generally defined by an imaginary line extending along a filament of the lamp 135 to the tip of the lamp 135. The orientation of the lamp 135 may be parallel or perpendicular to a chamber centerline.

Figure 1B:
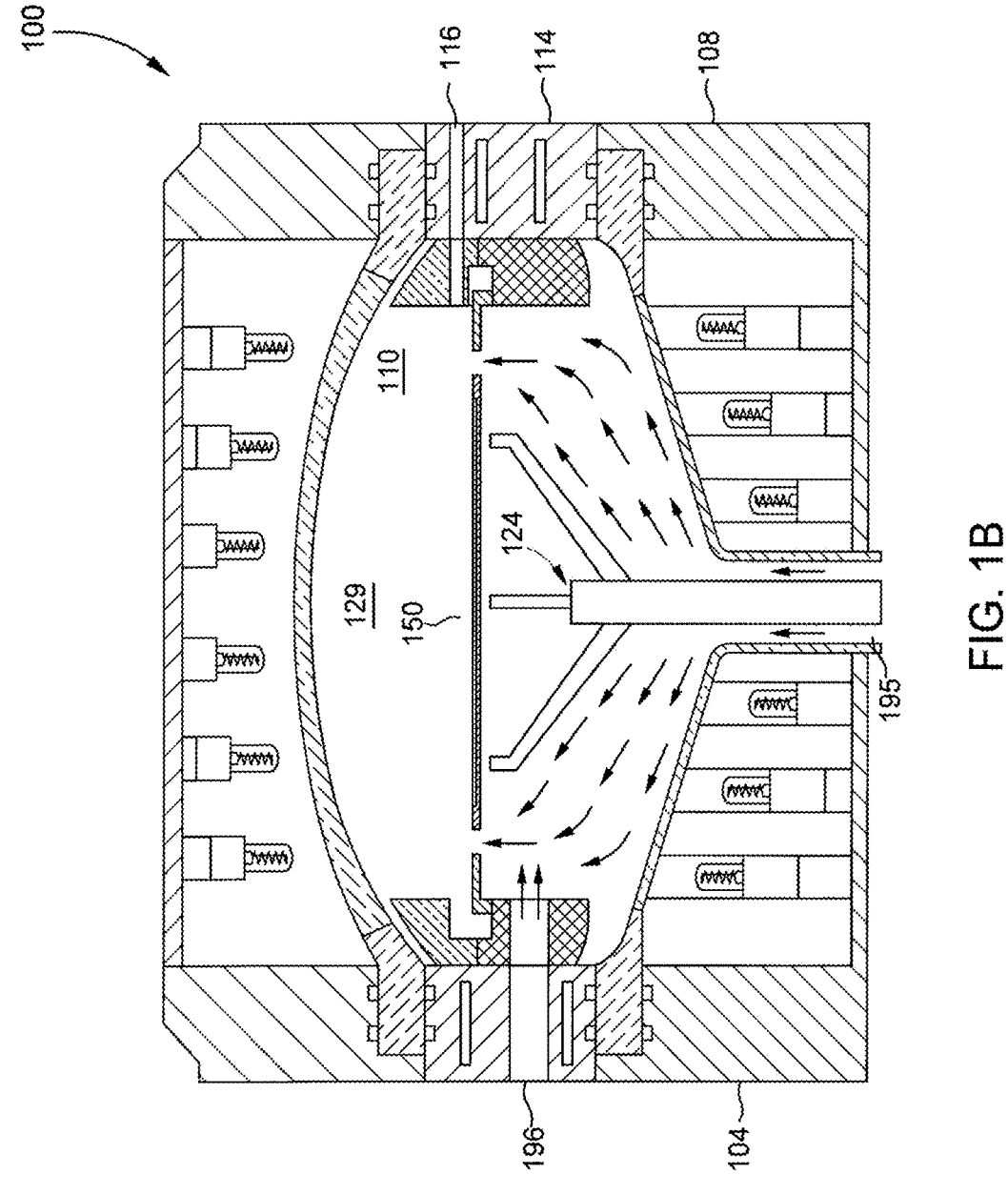
FIG. 1B is another schematic of the processing system, according to one or more embodiments described and discussed herein.

The EPI processing chamber 100 will additionally be discussed with respect to FIG. 1B. The base plate 114 includes a substrate transfer passage 116. The substrate transfer passage 116 is disposed through the base plate 114 opposite a cross gas flow inlet 196. The substrate transfer passage 116 is formed through the base plate 114. The substrate transfer passage 116 is configured to allow the substrate 150 to pass therethrough from a transfer chamber of a cluster tool (not shown).

A purge gas inlet 192 is disposed in the susceptor shaft passage 195 between the susceptor assembly 124 and the surrounding lower lamp module 104 into the lower chamber 113.

Figures 2A, 2B:
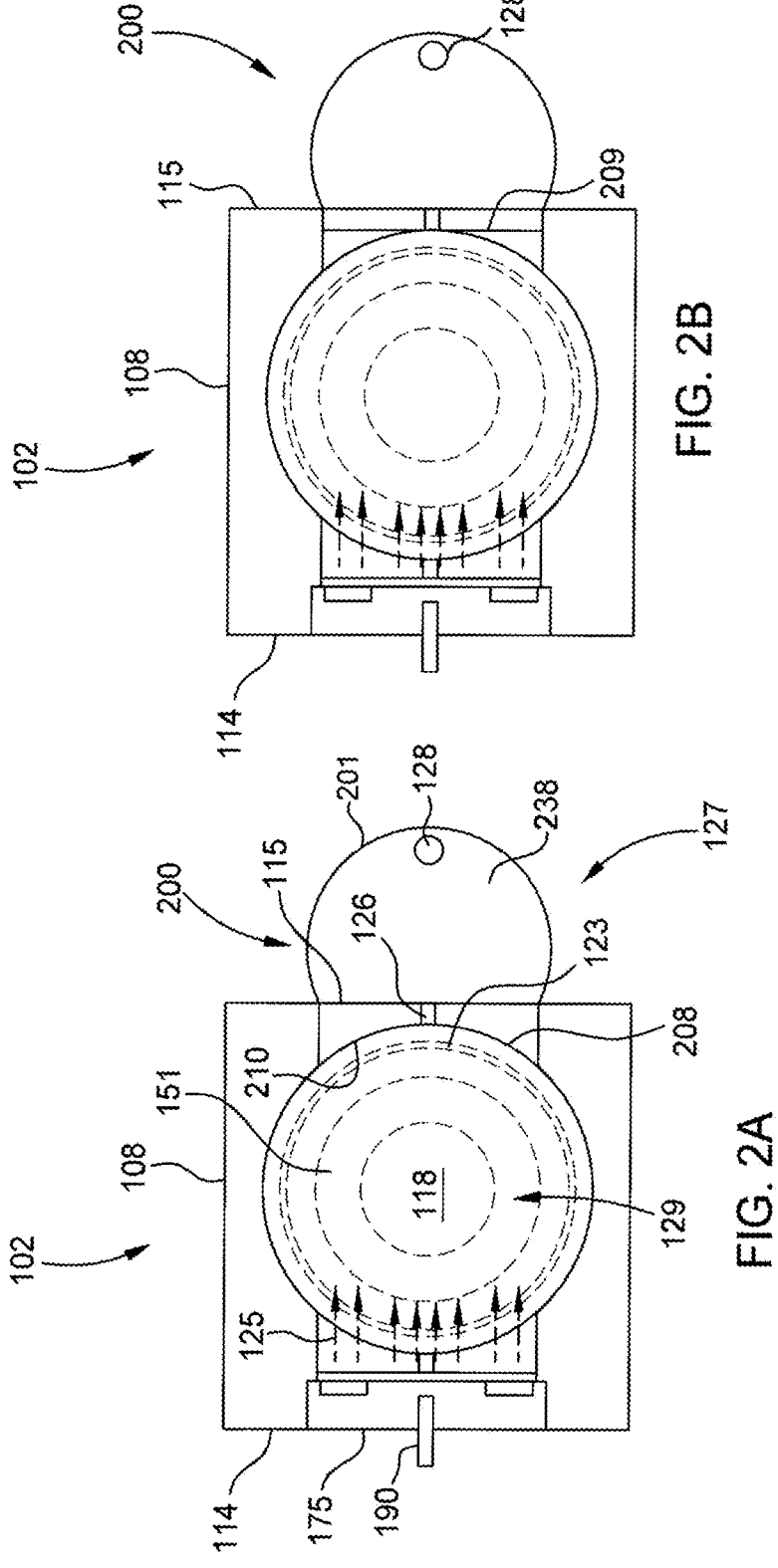
FIG. 2A is a schematic top view of the exhaust slit assembly of FIG. 1, according to one or more embodiments described and discussed herein.
FIG. 2B is another schematic top view of the exhaust slit assembly of FIG. 1, according to one or more embodiments described and discussed herein.

Returning to FIG. 1A, a chamber exhaust passage 152 is disposed through base plate 114 and coupled to an exhaust slit assembly (Identified by reference number 200 in FIGS. 2A-2B). The base plate 114 includes one or more gas injectors 198 disposed therethrough. The gas injectors 198 are configured to supply process gases to the internal volume 110. The gas injectors 198 are fluidly coupled to one or more process gas supply sources. The lower chamber exhaust passage 152 is disposed across from the substrate transfer passage 116 and connects the exhaust slit assembly 200 in the lower chamber lower chamber with an exhaust pump (not shown). The exhaust pump may also be coupled to and be in fluid communication with both of the upper chamber exhaust passage openings.

Figure 1C:
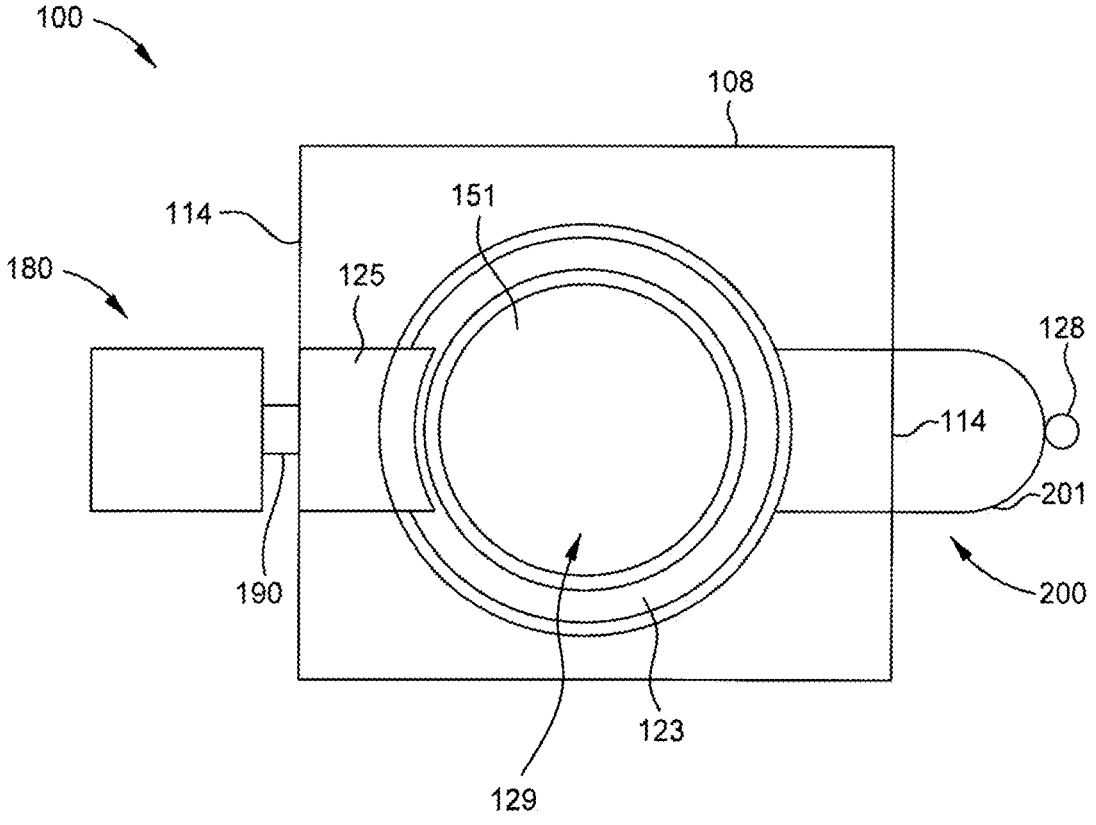
FIG. 1C is a schematic top view of the processing system, according to one or more embodiments described and discussed herein.

FIG. 2A is a simplified schematic top view of a portion of the substrate processing system 199 which includes the EPI processing chamber 100 and the exhaust slit assembly 200. The precursor activator 180 (As shown in FIG. 1C) is coupled to the EPI processing chamber 100 via the delivery line 190. As the gas reaches the plasma generation region above the substrate 150, the gas is excited to form a plasma. Downstream from the plasma generation region gas neutrals, gas ions, and gas radicals flow from the plasma generation region towards the exhaust slit assembly 200.

A flow assembly 125 is disposed in the chamber inlet 175 extending through the base plate 114 of the chamber body 108 for process gas to flow from the precursor activator 180 to the processing region 129 of the EPI processing chamber 100. The flow assembly 125 is configured to reduce flow constriction or control the flow distribution of gas flowing to the EPI processing chamber 100.

The EPI processing chamber 100 has a distributed pumping structure 127 to remove process gases from the EPI processing chamber 100. The distributed pumping structure 127 includes the exhaust slit assembly 200. The exhaust slit assembly 200 is provided adjacent to a second side of the base plate 114 of the chamber body 108. The exhaust slit assembly 200 is shaped to control the distribution of gas flowing from the flow assembly 125 across the substrate 150 to a pumping port 128.

FIGS. 2A-2B show perspective views of the exhaust slit assembly 200. The exhaust slit assembly 200 has a body 201. The body 201 has an exhaust opening 210 (i.e., exhaust tunnel). The exhaust slit assembly 200 may be fabricated from a material such as quartz or silica to reduce interaction with process gases. In embodiments for use with nitrogen radicals, the exhaust slit assembly 200 can be made from nitridation resistant material, such as silicon nitride.

The exhaust slit assembly 200 may optionally have a blocker plate 126. The blocker plate 126 promotes a uniform thickness of a layer formed on the substrate 150. For example, without the blocker plate 126, the layer at the center of the substrate 150 can be up to significantly thicker than the layer at the edge of the substrate 150. The blocker plate 126 maintains the spread of the gas flow to substantially cover edge portions of the substrate to promote thickness uniformity.

The exhaust opening 210 may be elongated and have a shape similar to a dumbbell or dog bone. The shape of the exhaust opening 210 of the exhaust slit assembly 200 varies the conductance from center to edge of the opening 210, which promotes thickness uniformity of deposited material layers. In one embodiment, the shape of the exhaust opening 210 is varied during processing to adjust the conductance profile. In another example, the shape of the exhaust opening 210 is fixed to set a conductance profile for the exhaust slit assembly 200 in the EPI processing chamber 100.

The shape of the opening 210, i.e., a dog bone shape, may be in a plane parallel to the sidewall 115 of the chamber body 108. For example, the exhaust opening 210 may geometrically be a flat opening 209. Alternately, the shape of the exhaust slit assembly 200 may extend from sidewall 115 to the pumping port 128. A small plenum 238 may optionally exist around the pumping port 128. The dog bone shape of the exhaust opening 210 may extend perpendicular from the sidewall 115 to the pumping port 128 or alternatively, to the plenum 238. In this manner the shape may be more easily formed into the exhaust slit assembly 200 through machining.

In yet another example, the shape of the opening 210 may be in a curved plane of the interior volume of the chamber body 108 as shown by curved opening 208. The shape may be provided by a plate such that the dog bone shape is merely along the opening 210. Alternately, the shape may extend from the opening to the pumping port 128 or alternately, to the plenum 238. In this manner, the flow of exhaust may be better controlled through the exhaust slit assembly 200.

It is been found that the shape of the opening 210 directly affects the flow process gases traveling across the processing region 129 of the EPI processing chamber 100. By configuring the opening 210 of the exhaust slit with a dumbbell or dog bone shape, the conductance can be controlled from center to edge. The conductance profile of the opening 210 may be fixed or vary during processing. The shape of the opening 210 will be discussed with respect to the elevation view of the opening to 210.

Figure 3:
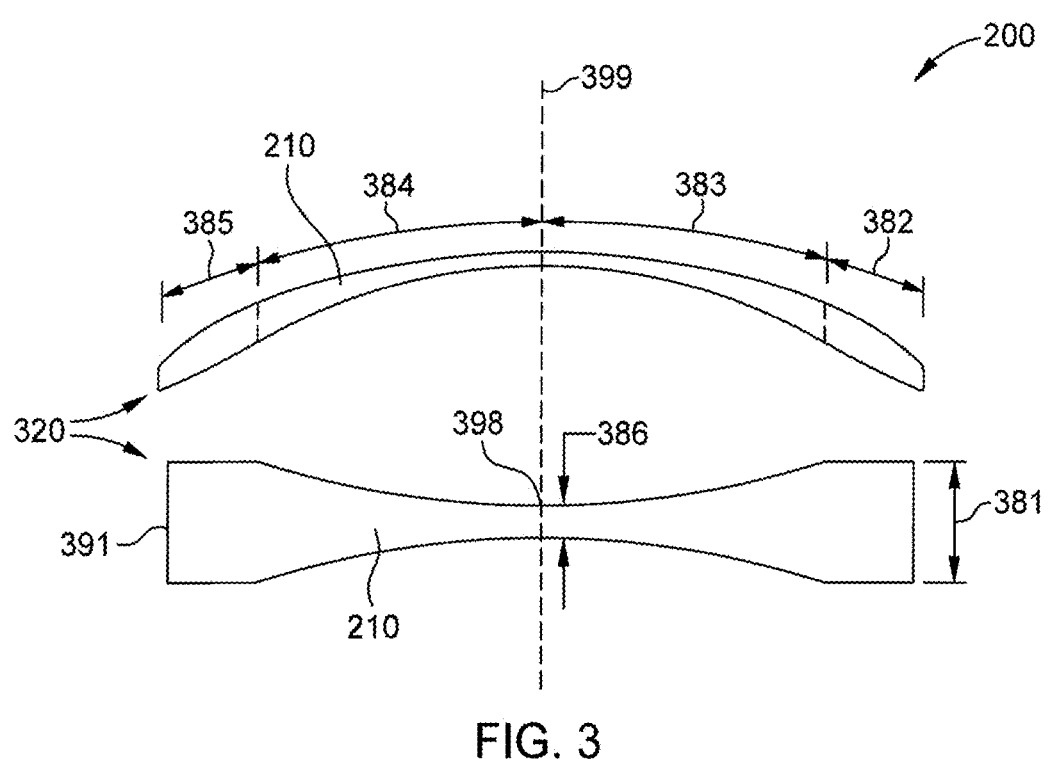
FIG. 3 is two elevation views of the opening in the exhaust slit assembly shown in FIGS. 2A and 2B.

FIG. 3 illustrates two elevation views of the opening in the exhaust slit assembly shown in FIGS. 2A and 2B. The opening 210 has a profile 320. The opening 210 has an outer edge 391 and a center 398 defined along a centerline 399 of the opening 210. The outer edge 391 is provided on both the left and right side of the center 398 of the opening 210, i.e., there are two outer edges 391. The profile 320 of the opening 210 is smaller at the center 398 compared to the outer edge 391. The profile 320 may be curved as shown by curved opening 208 in FIG. 2A, or flat as shown by flat opening 209 in FIG. 2B. The profile 320 may be symmetric about the centerline 399. The profile 320 may be split into four areas for ease of description. The four areas include a left side 385, a left center 384, a right center 383 and a right side 382. The left center 384 is defined to the left of the center 398 of the opening 210. The right center 383 is defined to the right of the center 398 of the opening 210.

The left side 385 and the right side 382 may have a rectangular shape. The left side 385 of the profile 320 may or may not be a mirror image of the right side 382. Thus, the profile 320 may be symmetrical. Alternately, the profile 320 may be asymmetrical. For example, the left side 385 and the right side 382 of the profile are not equal in size or shape. The left center 384 and the right center 383 may have a truncated bell shape, i.e., a trapezoid shape having bowed, or concave, legs connecting the two bases, i.e., a truncated funnel shape. The left center 384 of the profile 320 may or may not be a mirror image of the right center 383, wherein the short sides of the right center 383 and left center 384 are shared along the centerline 399. In totality, the combined shape of the left side 385, left center 384, the right center 383, right side 382 forms a dumbbell or dog-bone shape.

The left side 385 may extend between about 25% to about 35%, such as about 30%, of the distance from the outer edge 391 to the center 398. Similarly, the right side 382 may extend between about 25% to about 35%%, such as about 30%, of the distance from the outer edge 391 to the center 398. The left center 384 may extend about 70% of the distance from the center 398 of the opening 210 to the outer edge 391. Similarly, the right center 383 may extend about 70% of the distance from the center 398 to the outer edge 391.

A center height 386 of the opening 210 is defined along the vertical centerline 399 at the center 398 of the opening 210. An outer edge height 381 of the opening 210 is defined at the outer edge 391 of the opening 210 at both sides of the opening. The center height 386 and outer edge height 381 of the opening 210 have a length defined vertically with respect to the chamber body 108, i.e., in the same direction as the centerline 399.

The center height 386 may be varied from about 0.00 mm, where the center height 386 of the opening 210 is blocked or closed, to about 14.00 mm where the center height 386 is fully opened and no longer has the dog bone shape. In one example, the center height 386 of the opening 210 may be between about 3.00 mm to about 9.00 mm. In another example, the center height 386 of the opening 210 may be between about 3.9 mm to about 8.4 mm. The outer edge height 381 of the opening 210 may be between 10.00 mm to about 14.00 mm. However, the size at the outer edge height 381 of the opening 210 being greater as compared to the size of the center height 386 of the opening 210 has been found to provide the most desirable processing results on a substrate.

Figure 4:
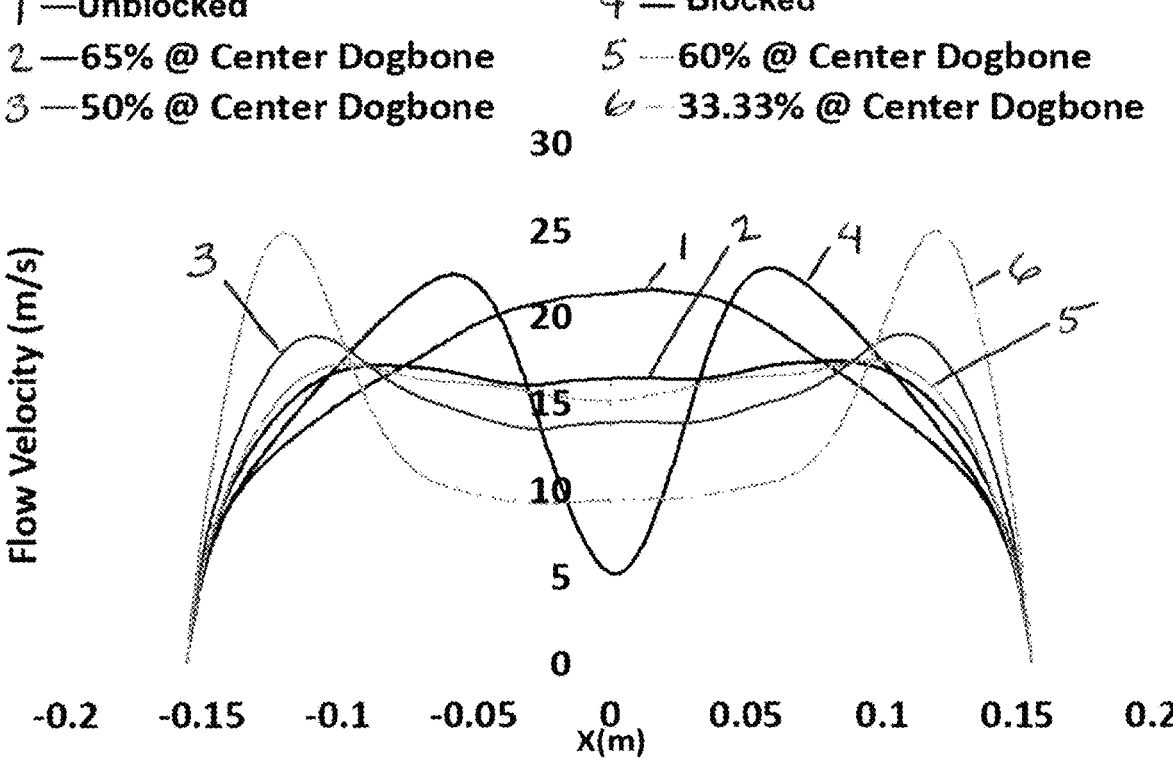
FIG. 4 is a graph depicting the flow velocities from a center location of the exhaust slit assembly according to multiple examples.

A simulation as well as tests were performed where a portion of the opening 210 for the exhaust slit assembly 200 was blocked at the center 398 of the opening 210. Having an area of exhaust slit tunnel area blocked by the blocker plate 126 provided a broader rectangular deposition profile versus a plume shape deposition thickness profile when the blocker plate 126 was not used under the same conditions. The blocker plate 126 created a recirculation region over the substrate especially adjacent to the blocked area in exhaust. Similar, simulation tests were performed for various opening ratios between the center height 386 and the outer edge height 381. The test measured the exhaust velocity from the center 398 to the outer edge 391 of the exhaust opening 210. The profile shape of the opening was found to impact the flow. The opening ratios varied from 0% with a blocker plate 126 where the middle is entirely closed off to 100% where the center height 386 was equal to the outer edge height 381. For example, ratios of 65% open at the center height 386, 60% open at the center height 386, 50% open at the center height 386, on down to 30% open at the center height 386 were all measured and compared to conventional openings of 100% open at the center height 386. The results are summarized in graph shown in FIG. 4. FIG. 4 is a graph depicting the flow velocities from the center 398 of the exhaust slit assembly 200 according to multiple examples.

Table 1 illustrates that between about a 25% and about a 40% opening in the center will provide a flat flow rate profile. Meanwhile, an opening between about 50% and about 70% in the center produces a dome shape flow rate profile with less center to edge variation. The outer edge height 381 is greater than or equal the center height 386. A ratio of the center height 386 to the outer edge height 381 (center height 386/outer edge height 381) may be between about 30% to about 40%. In another example, a ratio of the center height 386 to the outer edge height 381 is between about 50% to about 70%. In yet another example, a ratio of the center height 386 to the outer edge height 381 is between about 50% to about 80%.

While the foregoing is directed to embodiments of the disclosure, other and further embodiments may be devised without departing from the basic scope thereof, and the scope thereof is determined by the claims that follow. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including".

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A processing chamber, comprising:
a chamber body, wherein the chamber body comprises:
  a first side;
  a second side opposite the first side;
  an upper window having an optically transparent window; and
  a base, wherein the first side, the second side, the upper window and the base define and enclose a thermal processing region;
a gas injectors disposed adjacent the first side, wherein the gas injectors is configured to introduce a processing gas into the thermal processing region; and
an exhaust slit assembly disposed adjacent to the second side, the exhaust slit assembly comprising:
  an opening exposed to the thermal processing region, the opening having a center and outer edges, the center of the opening and outer edges of the opening vertically defined between the upper window and the base, and wherein an outer height at the outer edges of the opening is at least 30% larger in a vertical direction than a center height at the center of the opening, and wherein the opening has a rectangular shape at the outer edges and is curved through the center between the outer edges.

2. A processing chamber, comprising:
a chamber body, wherein the chamber body comprises:
  a first side;
  a second side opposite the first side;
  an upper window having an optically transparent window; and
  a base, wherein the first side, the second side, the upper window and the base define and enclose a thermal processing region;
a gas injectors disposed adjacent the first side, wherein the gas injectors is configured to introduce a processing gas into the thermal processing region; and
an exhaust slit assembly disposed adjacent to the second side, the exhaust slit assembly comprising:
  an opening exposed to the thermal processing region, the opening having a center and an outer edge of the opening, the center of the opening and edge of the opening vertically defined between the upper window and the base, and wherein an outer height at the edge of the opening is at least 30% larger in a vertical direction than a center height at the center of the opening, wherein the opening comprises:
  a blocker plate disposed at the center of the opening.

3. The processing chamber of claim 1, wherein a ratio of the center height of the opening to the outer height of the opening is between about 30% to about 80%.

4. The processing chamber of claim 1, wherein a ratio of the center height of the opening to the outer height of the opening is between about 30% to about 40%.

5. The processing chamber of claim 1, wherein a ratio of the center height of the opening to the outer height is between about 50% to about 70%.

6. The processing chamber of claim 1, wherein the opening further comprises:

a left side;

a left center;

a right center; and a right side, wherein the left side and the right side have a rectangular shape, and the left center and the right center has a trapezoid shape with curved legs between two bases.

7. The processing chamber of claim 6, wherein the left side and the right side each extend between about 25% to about 35% of a distance from the outer edges to the center, and wherein the left center and the right center each extend between about 75% to about 65% of a distance from the center to the outer edges.

8. The processing chamber of claim 6, wherein the left side, left center, right center and right side form a dog-bone shape.

9. An exhaust slit assembly comprising:

a body, the body having an elongated opening configured to receive gas, the elongated opening having a dog bone shape, wherein the elongated opening has a center height of the opening disposed at a center of the elongated opening and an outer height of the opening disposed along outer edges of the elongated opening, wherein the outer height of the opening is at least 30% larger vertically than the center height of the opening, wherein the elongated opening has a rectangular shape at the outer edges and is curved through the center between the outer edges.

10. The exhaust slit assembly of claim 9, wherein the dog bone shape of the elongated opening is asymmetrical with a left edge of the outer edges of the opening and a right edge of the outer edges of the opening are not equal.

11. The exhaust slit assembly of claim 9, wherein a ratio of the center height of the opening to the outer height of the opening is between about 30% to about 80%.

12. The exhaust slit assembly of claim 9, wherein a ratio of the center height of the opening to the outer height is between about 30% to about 40%.

13. The exhaust slit assembly of claim 9, wherein a ratio of the center height of the opening to the outer height is between about 50% to about 70%.

14. The exhaust slit assembly of claim 9, wherein a ratio of the center height of the opening to the outer height is about 0%.

15. The exhaust slit assembly of claim 9, wherein the elongated opening further comprises:

a left side;

a left center;

a right center; and a right side, wherein the left side and the right side have a rectangular shape, and the left center and the right center has a trapezoid shape with curved legs between two bases.

16. The exhaust slit assembly of claim 15, wherein the left side and the right side each extend about 30% of a distance from the outer edges outer edge to the center, and wherein the left center and the right center each extend about 70% of a distance from the center to the outer edges.

17. A method for thermally processing a substrate, the method comprising:

flowing a processing gas into a processing chamber through a first opening and into a processing region containing a substrate;

flowing the processing gas laterally across the substrate from the first opening towards the exhaust slit assembly of claim 9;

heating the substrate in the presence of the processing gas; and depositing a layer of material on the heated substrate in the presence of the processing gas.

18. The method of claim 17 further comprising:

flowing the process gas past a blocker plate disposed at the middle of the opening.

19. The method of claim 17, wherein the opening has an outer height and a center height, and wherein a ratio of the center height to the outer height is between about 30% to about 80%.

20. The method of claim 17 further comprising:

changing the conductance of the opening by changing the center height of the opening.

* * * * *